(12) United States Patent
Cheong et al.

(10) Patent No.: US 11,540,391 B2
(45) Date of Patent: Dec. 27, 2022

(54) DISPLAY DEVICE

(71) Applicant: Samsung Display Co., Ltd., Yongin-si (KR)

(72) Inventors: Seung Hwan Cheong, Hwaseong-si (KR); Ah Young Son, Seoul (KR); Chan Yoon Woo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 238 days.

(21) Appl. No.: 16/831,122

(22) Filed: Mar. 26, 2020

(65) Prior Publication Data

US 2021/0037647 A1 Feb. 4, 2021

(30) Foreign Application Priority Data

Jul. 30, 2019 (KR) .......................... 10-2019-0092403

(51) Int. Cl.
| | | |
|---|---|---|
| *H05K 1/11* | (2006.01) | |
| *H05K 1/18* | (2006.01) | |
| *H05K 1/14* | (2006.01) | |
| *H05K 1/02* | (2006.01) | |

(52) U.S. Cl.
CPC .......... *H05K 1/118* (2013.01); *H05K 1/0219* (2013.01); *H05K 1/14* (2013.01); *H05K 1/189* (2013.01); *H05K 2201/09227* (2013.01); *H05K 2201/10128* (2013.01)

(58) Field of Classification Search
CPC . H05K 2201/10128; H05K 2201/0969; H05K 2201/09227; H05K 2201/10681; H05K 2201/09681; H05K 1/0225; H05K 1/0227; H05K 1/118; H05K 1/0219; H05K 1/14; H05K 1/189; H05K 1/147; H01L 27/3276; H01L 27/3244; H01L 51/5203
See application file for complete search history.

(56) References Cited

U.S. PATENT DOCUMENTS

| | | | | |
|---|---|---|---|---|
| 5,675,299 | A | * 10/1997 | Suski | ................. H05K 1/0224 333/1 |
| 2001/0010271 | A1 | * 8/2001 | Lin | ...................... H05K 1/0253 174/255 |
| 2012/0275122 | A1 | * 11/2012 | Howard | ................. H01P 3/026 174/36 |
| 2017/0287814 | A1 | * 10/2017 | Kim | ........................ H01L 23/29 |

FOREIGN PATENT DOCUMENTS

| | | |
|---|---|---|
| JP | 3397707 B2 | 4/2003 |
| JP | 6368078 B2 | 8/2018 |

* cited by examiner

*Primary Examiner* — Roshn K Varghese
(74) *Attorney, Agent, or Firm* — Lewis Roca Rothgerber Christie LLP

(57) ABSTRACT

A display device includes: a display panel; and a first substrate connected to the display panel, wherein the first substrate comprises: a first base substrate; a first wiring layer having a plurality of first signal wirings on the first base substrate; and a first ground wiring layer on the first wiring layer, wherein the first ground wiring layer comprises a mesh pattern area and a non-mesh pattern area, wherein the mesh pattern area comprises a plurality of first mesh patterns and openings surrounded by adjacent first mesh patterns, and the non-mesh pattern area comprises a plurality of second mesh patterns and non-mesh patterns surrounded by adjacent second mesh patterns, wherein the non-mesh patterns are physically connected to the adjacent second mesh patterns.

8 Claims, 14 Drawing Sheets

DISPLAY DEVICE

CROSS-REFERENCE TO RELATED APPLICATION

The present application claims priority to and the benefit of Korean Patent Application No. 10-2019-0092403, filed on Jul. 30, 2019, in the Korean Intellectual Property Office, the disclosure of which is incorporated herein by reference in its entirety.

BACKGROUND

1. Field

Aspects of some example embodiments of the present disclosure relate to a display device.

2. Description of the Related Art

As the information society develops, the demand for display devices for displaying images is increasing in various forms. For example, display devices are being utilized with various electronic devices such as smartphones, digital cameras, notebook computers, navigation devices, and smart televisions. Such display devices may include flat panel display devices such as liquid crystal display devices, field emission display devices, and organic light emitting display devices. Of these flat panel display devices, organic light emitting display devices can display images without a backlight unit for providing light to the display panel because each pixel of the display panel includes a light emitting element capable of emitting light by itself.

Each pixel of an organic light emitting display device may include a light emitting element, a driving transistor, which controls the amount of driving current supplied from a power line to the light emitting element according to a voltage of a gate electrode, and an emission control transistor, which controls a connection between the driving transistor and the light emitting element.

The above information disclosed in this Background section is only for enhancement of understanding of the background and therefore the information discussed in this Background section does not necessarily constitute prior art.

SUMMARY

Aspects of some example embodiments the present disclosure include a display device in which changes to the impedance of transmission signal wirings of a driver circuit board for driving a display panel by adjacent wirings may be prevented or reduced.

However, aspects of example embodiments of the present disclosure are not restricted to those specifically described herein. The above and other aspects of the present disclosure will become more apparent to one of ordinary skill in the art to which the present disclosure pertains by referencing the detailed description of the present disclosure given below.

According to some example embodiments of the present disclosure, a display device includes: a display panel; and a first substrate which is connected to the display panel, wherein the first substrate includes a first base substrate, a first wiring layer having a plurality of first signal wirings on the first base substrate, and a first ground wiring layer on the first wiring layer, wherein the first ground wiring layer includes a mesh pattern area and a non-mesh pattern area, wherein the mesh pattern area includes a plurality of first mesh patterns and openings surrounded by adjacent first mesh patterns, and the non-mesh pattern area includes a plurality of second mesh patterns and non-mesh patterns surrounded by adjacent second mesh patterns, wherein the non-mesh patterns are physically connected to the adjacent second mesh patterns.

According to some example embodiments, the display device may further include a second wiring layer having a plurality of second signal wirings on the first ground wiring layer, wherein the first signal wirings may extend along a first direction, and the second signal wirings may extend along a second direction intersecting the first direction.

According to some example embodiments, the mesh pattern area may be in an area where the first signal wirings and the second signal wirings do not overlap, and the non-mesh pattern area may be in an area where the first signal wirings and the second signal wirings overlap.

According to some example embodiments, the first substrate may further include a second ground wiring layer spaced apart from the first wiring layer with the first base substrate interposed between the second ground wiring layer and the first wiring layer and a second base substrate spaced apart from the first base substrate with the first wiring layer interposed between the second base substrate and the first base substrate, wherein the first ground wiring layer may be spaced apart from the first wiring layer with the second base substrate interposed between the first ground wiring layer and the first wiring layer.

According to some example embodiments, the display device may further include a second substrate which is connected to the display panel and the first substrate, wherein the second substrate may include a driver chip.

According to some example embodiments, the first substrate may include a circuit board, and the second substrate may include a flexible circuit film.

According to some example embodiments, the display device may further include a main circuit board which is electrically connected to the first substrate, wherein the first signal wirings may be configured to receive transmission signals from the main circuit board.

According to some example embodiments, the transmission signals may include image signals or timing control signals, and the first signal wirings may be electrically connected to the driver chip.

According to some example embodiments, the second signal wirings may include power signals.

According to some example embodiments, the first substrate may further include a power supply unit, and the second signal wirings may pass through the second substrate and may be electrically connected to power wirings of the display panel.

According to some example embodiments, the first signal wirings may include a positive signal wiring and a negative signal wiring, wherein absolute values of signal intensities of the positive signal wiring and the negative signal wiring may be the same.

According to some example embodiments, the first ground wiring layer may include a shielding metal.

According to some example embodiments of the present disclosure, a display device includes: a display panel; and a first substrate which is connected to the display panel, wherein the first substrate includes a first base substrate, a first wiring layer having a plurality of first signal wirings on the first base substrate, a first ground wiring layer on the first wiring layer, and a second wiring layer on the first ground wiring layer and having a plurality of second signal wirings, wherein the first ground wiring layer includes a plurality of mesh patterns and openings surrounded by adjacent mesh patterns, and the second signal wirings overlap the mesh patterns in a thickness direction.

According to some example embodiments, the second signal wirings may not overlap the openings in the thickness direction.

According to some example embodiments, a width of each of the second signal wirings may be smaller than that of each of the mesh patterns.

According to some example embodiments, the first signal wirings may extend along a first direction, and the mesh patterns may include a first extension portion and a second extension portion which extend along the first direction and are spaced apart from each other in a second direction intersecting the first direction and connection portions which physically connect the first extension portion and the second extension portion, wherein the second signal wirings may extend along a direction in which the connection portions extend.

According to some example embodiments, the first substrate may further include a second ground wiring layer spaced apart from the first wiring layer with the first base substrate interposed between the second ground wiring layer and the first wiring layer and a second base substrate spaced apart from the first base substrate with the first wiring layer interposed between the second base substrate and the first base substrate, wherein the first ground wiring layer may be spaced apart from the first wiring layer with the second base substrate interposed between the first ground wiring layer and the first wiring layer.

According to some example embodiments, the display device may further include a second substrate which is connected to the display panel and the first substrate, wherein the second substrate may include a driver chip.

According to some example embodiments, the display device may further include a main circuit board which is electrically connected to the first substrate, wherein the first signal wirings may be configured to receive transmission signals from the main circuit board.

According to some example embodiments, the transmission signals may include image signals or timing control signals, and the first signal wirings may be electrically connected to the driver chip.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
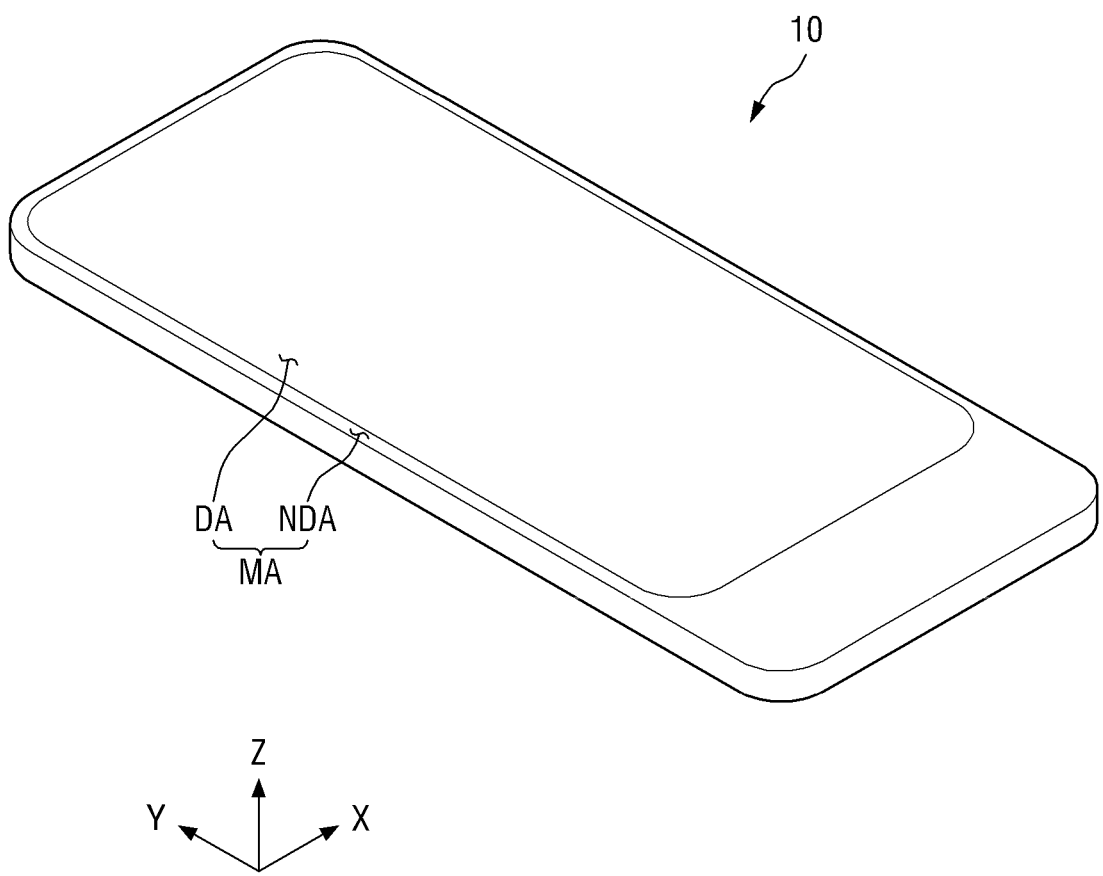
FIG. 1 is a perspective view of a display device according to some example embodiments.

Certain characteristics and features of some example embodiments of the present disclosure and methods of accomplishing the same may be understood more readily by reference to the following detailed description of some example embodiments and the accompanying drawings. Embodiments according to the present disclosure may, however, be embodied in many different forms and should not be construed as being limited to the embodiments set forth herein. Rather, these example embodiments are provided so that this disclosure will be more thorough and more complete and will more-fully convey the concepts of the invention to those skilled in the art, and the present disclosure will only be defined by the appended claims.

It will be understood that when an element or layer is referred to as being "on" another element or layer, the element or layer can be directly on another element or layer or intervening elements or layers. Like numbers refer to like elements throughout. The shapes, sizes, ratios, angles, numbers, and the like shown in the drawings for describing embodiments are merely examples, and the present disclosure is not limited thereto.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present disclosure.

Respective features of some example embodiments of the present disclosure may be partially or entirely joined or combined with each other, and technically various linkages and driving may be possible. The embodiments may be implemented independently or in association with each other.

Hereinafter, example embodiments will be described with reference to the attached drawings.

Figure 2:
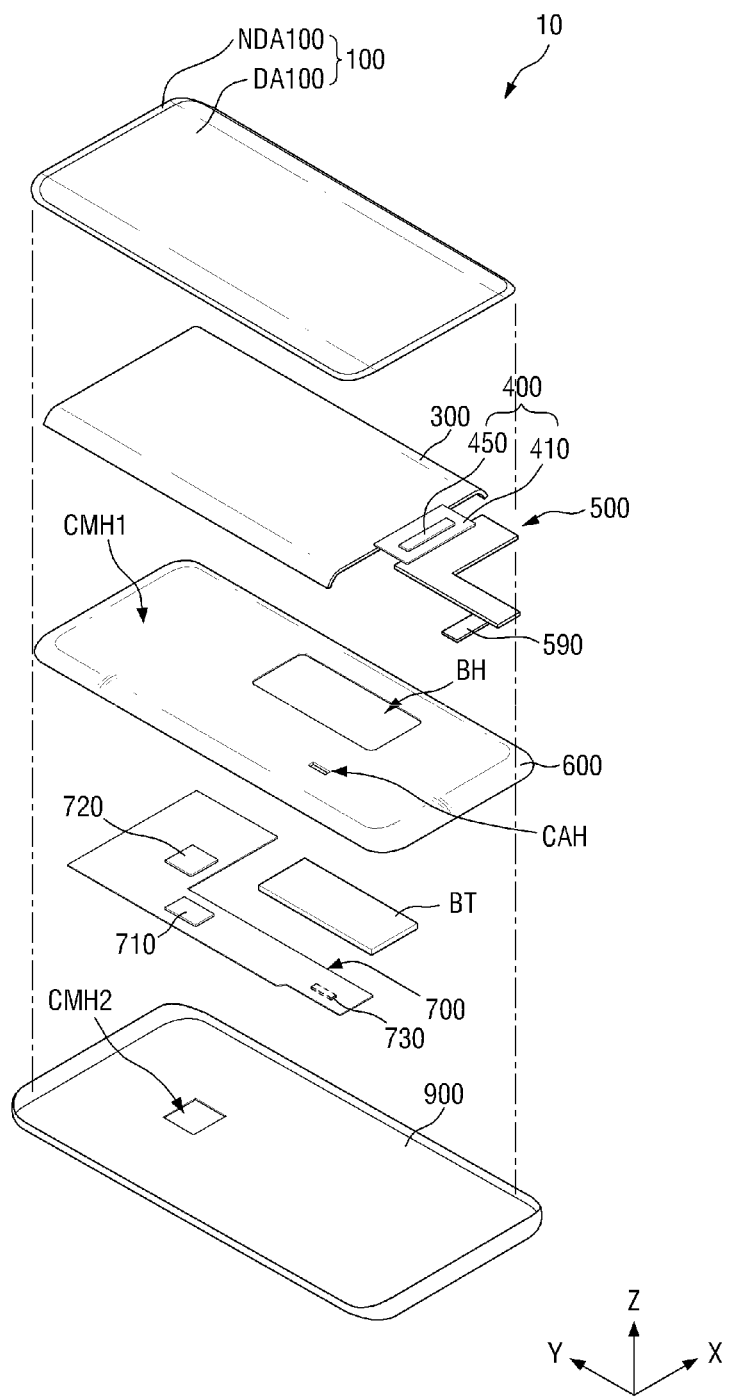
FIG. 2 is an exploded perspective view of the display device according to some example embodiments.
Figure 3:
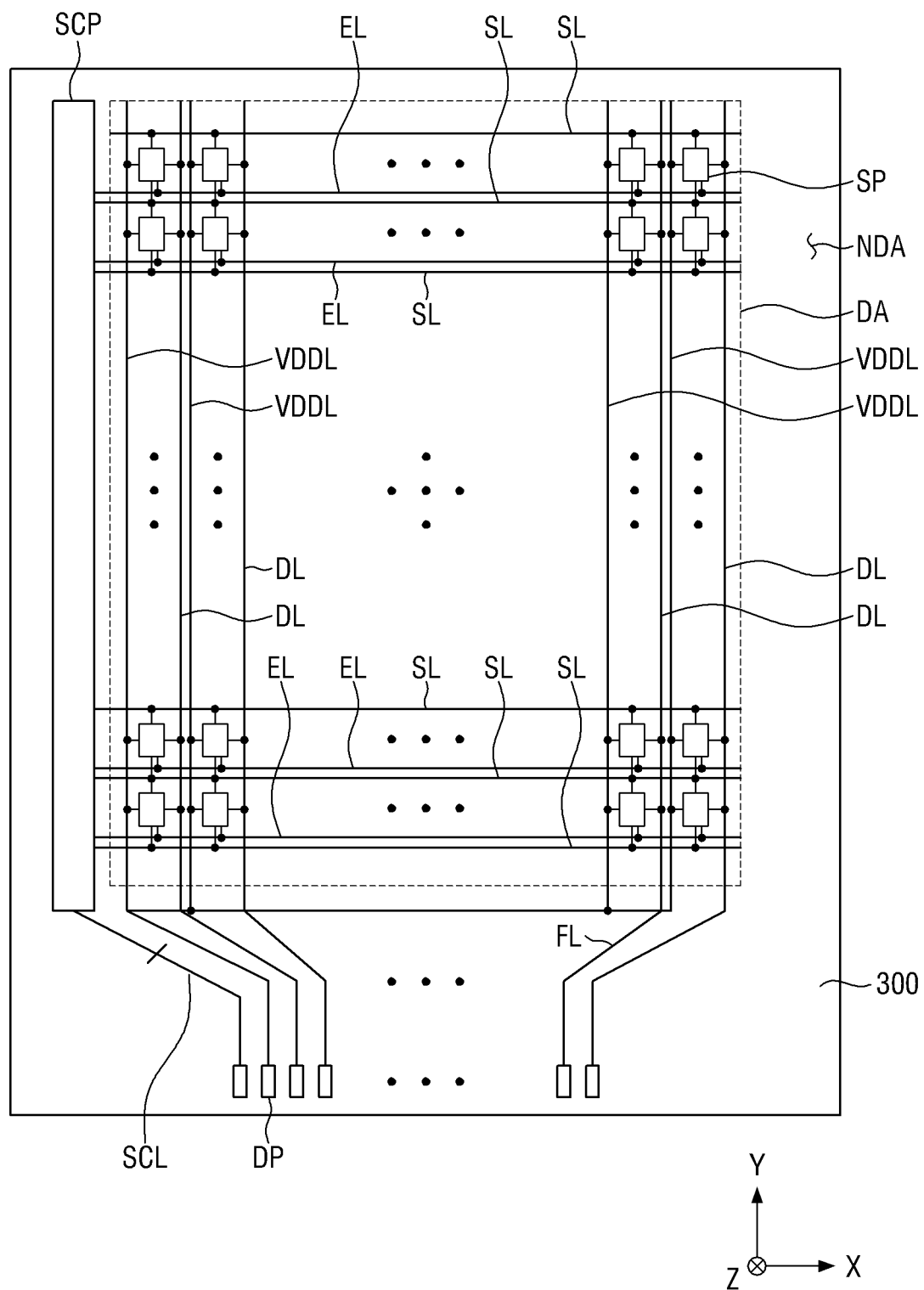
FIG. 3 is a plan view of the display device according to some example embodiments.
Figure 4:
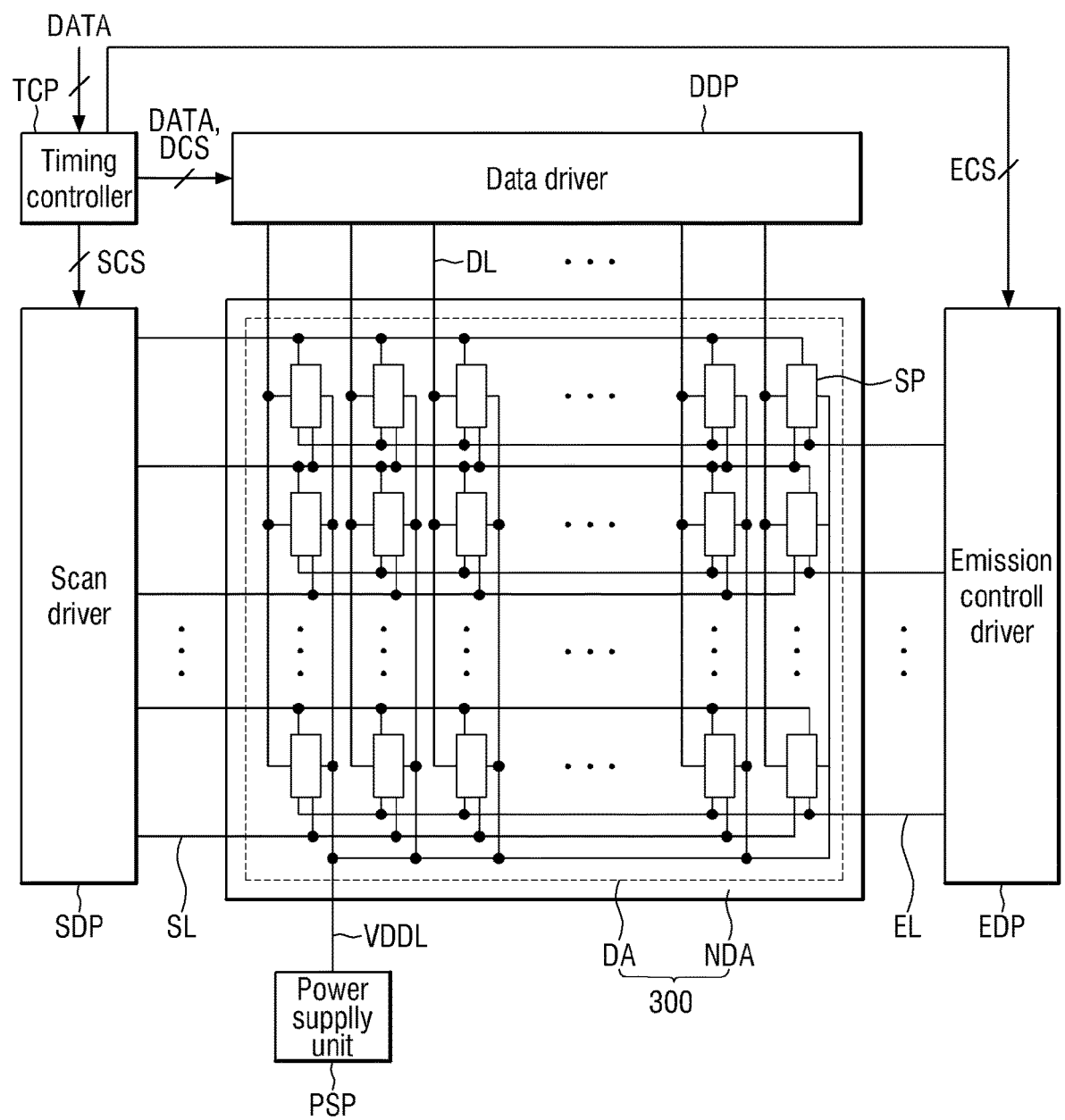
FIG. 4 is a block diagram of the display device according to some example embodiments.

FIG. 1 is a perspective view of a display device 10 according to some example embodiments. FIG. 2 is an exploded perspective view of the display device 10 according to some example embodiments. FIG. 3 is a plan view of the display device 10 according to some example embodiments. FIG. 4 is a block diagram of the display device 10 according to some example embodiments.

In the present specification, the terms "above", "top" and "upper surface" indicate an upward direction from a display panel 300, that is, a Z-axis direction, and the terms "below," "bottom" and "lower surface" indicate a downward direction from the display panel 300, that is, a direction opposite to the Z-axis direction. In addition, "left," "right," "upper" and "lower" indicate directions when the display panel 300 is viewed in a plan view (e.g., from a direction normal to a primary plane or planar surface of the display panel 300).

For example, "left" indicates a direction opposite to an X-axis direction, "right" indicates the X-axis direction, "upper" indicates a Y-axis direction, and "lower" indicates a direction opposite to the Y-axis direction.

Referring to FIGS. 1 through 4, the display device 10 is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation systems and ultra-mobile PCs (UMPCs), as well as in various products such as televisions, notebook computers, monitors, billboards, and any suitable electronic device operating as part of the Internet of things (IoT) (e.g., smart electronic devices, smart appliances, proximity devices, etc.).

The display device 10 may be a light emitting display device such as an organic light emitting display device using organic light emitting diodes, a quantum dot light emitting display device including quantum dot light emitting layers, an inorganic light emitting display device including inorganic semiconductors, or a micro light emitting display device using micro light emitting diodes. A case where the display device 10 is an organic light emitting display device will be mainly described below, but embodiments are not limited thereto.

The display device 10 may include a cover window 100, the display panel 300, a flexible circuit film 400 or a second substrate, a circuit board 500 or a first substrate, a bracket 600, a main circuit board 700, and a bottom cover 900.

The cover window 100 may be located on the display panel 300 to cover an upper surface of the display panel 300. Thus, the cover window 100 may function to protect the upper surface of the display panel 300, for example, from external contaminants or damage caused by forces from external objects.

The cover window 100 may include a light transmitting portion DA100 corresponding to the display panel 300 and a light shielding portion NDA100 corresponding to an area other than the display panel 300. The cover window 100 may be located in a first area DR1 and second areas DR2. The light transmitting portion DA100 may be located in a part of the first area DR1 and a part of each of the second areas DR2. The light shielding portion NDA100 may be formed to be opaque. Alternatively, the light shielding portion NDA100 may be formed as a decorative layer having a pattern that may be shown to a user when an image is not displayed. That is, according to some example embodiments, the light shielding portion NDA110 may include decorative engravings or elements.

The display panel 300 may be located under the cover window 100. The display panel 300 may be overlapped by the light transmitting portion 100DA of the cover window 100. The display panel 300 may be located in the first area DR1 and the second areas DR2. Therefore, an image of the display panel 300 can be seen not only in the first area DR1 but also in the second areas DR2.

The display panel 300 may be a light emitting display panel including a plurality of light emitting elements. For example, the display panel 300 may be an organic light emitting display panel using organic light emitting diodes that include organic light emitting layers, a micro light emitting diode display panel using micro light emitting diodes, a quantum dot light emitting display panel including quantum dot light emitting diodes that include quantum dot light emitting layers, or an inorganic light emitting display panel using inorganic light emitting elements that include inorganic semiconductors. Embodiments in which the display panel 300 is an organic light emitting display panel will be mainly described below, but embodiments are not limited thereto.

The flexible circuit film 400 and the circuit board 500 may be attached to a side of the display panel 300. The flexible circuit film 400 may include a base film 410 and a driver circuit 450 located on the base film 410.

An end of the flexible circuit film 400 may be attached onto pads DP provided on the side of the display panel 300 by using an anisotropic conductive film. The flexible circuit film 400 may be a flexible printed circuit board that can be bent, a rigid printed circuit board that is rigid and not easily bent, or a composite printed circuit board including both a rigid printed circuit board and a flexible printed circuit board.

The driver circuit 450 and a power supply unit 580 for supplying driving voltages to drive the display panel 300 may be located on the circuit board 500.

The bracket 600 may be located under the display panel 300. The bracket 600 may include plastic, metal, or both plastic and metal. The bracket 600 may include a first camera hole CMH1 into which a camera device 720 is inserted, a battery hole BH in which a battery BT is located, and a cable hole CAH through which a cable 590 connected to the circuit board 500 passes.

The main circuit board 700 and the battery BT may be located under the bracket 600. The main circuit board 700 may be a printed circuit board or a flexible printed circuit board.

The main circuit board 700 may include a main processor 710, the camera device 720, and a main connector 730. The main processor 710 may be formed as an integrated circuit.

The camera device 720 may be located on both upper and lower surfaces of the main circuit board 700, the main processor 710 may be located on the upper surface of the main circuit board 700, and the main connector 730 may be located on the lower surface of the main circuit board 700.

The main processor 710 may control all the functions of the display device 10. For example, the main processor 710 may output digital video data to the flexible circuit film 400 through the circuit board 500 so that the display panel 300 can display an image.

The main processor 710 may be an application processor, central processing unit, or system chip formed as an integrated circuit.

The camera device 720 processes an image frame such as a still image or a moving image obtained by an image sensor in a camera mode and outputs the processed image frame to the main processor 710.

The cable 590 passing through the cable hole CAH of the bracket 600 may be connected to the main connector 730. Therefore, the main circuit board 700 may be electrically connected to the circuit board 500.

The battery BT may be arranged such that it does not overlap the main circuit board 700 in a third direction (Z-axis direction). The battery BT may be overlapped by the battery hole BH of the bracket 600.

The bottom cover 900 may be located under the main circuit board 700 and the battery BT. The bottom cover 900 may be fastened and fixed to the bracket 600. The bottom cover 900 may form the bottom exterior of the display device 10. The bottom cover 900 may include plastic, metal, or both plastic and metal.

A second camera hole CMH2 exposing a lower surface of the camera device 720 may be formed in the bottom cover 900. The position of the camera device 720 and the positions of the first and second camera holes CMH1 and CMH2 corresponding to the camera device 720 are not limited to the embodiment illustrated in FIG. 2.

The display panel 300 may be formed as a rectangular plane having short sides in a first direction (X-axis direction) and long sides in a second direction (Y-axis direction) intersecting the first direction (X-axis direction). Each corner where a short side extending in the first direction (X-axis direction) meets a long side extending in the second direction (Y-axis direction) may be rounded with a curvature (e.g., a set or predetermined curvature) or may be right-angled. The planar shape of the display panel 300 is not limited to a quadrilateral shape, but may also be another polygonal shape, a circular shape, or an elliptical shape. The display panel 300 may be formed flat. However, embodiments are not limited thereto, and the display panel 300 may also include curved portions formed at its left and right ends and having a constant curvature or a varying curvature. In addition, the display panel 300 may be formed to be flexible so that it can be bent, curved, folded, or rolled.

The display panel 300 may include a display area DA where pixels SP are formed to display an image and a non-display area NDA located around (e.g., outside a footprint of) the display area DA. The subpixels SP, as well as scan lines SL, emission lines EL, data lines DL and first driving voltage lines VDDL connected to the subpixels SP may located in the display area DA. The scan lines SL and the emission lines EL may extend parallel to each other in the first direction (X-axis direction), and the data lines DL may extend parallel to each other in the second direction (Y-axis direction) intersecting the first direction (X-axis direction). The first driving voltage lines VDDL may extend parallel to each other in the display area DA along the second direction (Y-axis direction). The first driving voltage lines VDDL extending parallel to each other in the display area DA along the second direction (Y-axis direction) may be connected to each other in the non-display area NDA.

Each of the subpixels SP may be connected to at least any one of the scan lines SL, any one of the data lines DL, at least one of the emission lines EL, and any one of the first driving voltage lines VDDL. In FIG. 2, a case where each of the subpixels SP is connected to two scan lines SL, one data line DL, one emission line EL, and one first driving voltage line VDDL is illustrated as an example. However, embodiments are not limited thereto. For example, each of the subpixels SP may also be connected to three scan lines SL instead of two scan lines SL.

Each of the subpixels SP may include a driving transistor DT, one or more switching transistors, a light emitting element, and a capacitor. The switching transistors are turned on in response to a scan signal received from a scan line SL. Accordingly, a data voltage of a data line DL may be applied to a gate electrode of the driving transistor DT. The driving transistor DT may supply a driving current to the light emitting element according to the data voltage applied to the gate electrode, thereby causing the light emitting element to emit light. The driving transistor DT and the switching transistors may be thin-film transistors. The light emitting element may emit light according to the driving current of the driving transistor DT. The light emitting element may be an organic light emitting diode including a first electrode, an organic light emitting layer, and a second electrode. The capacitor may keep the data voltage applied to the gate electrode of the driving transistor DT constant.

The non-display area NDA may be defined as an area extending from the outside of the display area DA to edges of the display panel 300. In the non-display area NDA, a scan driver SCP for transmitting scan signals to the scan lines SL, fan-out lines FL between the data lines DL and the flexible circuit film 400, and the pads DP connected to the flexible circuit film 400 may be located. The flexible circuit film 400 and the pads DP may be located at an edge of the display panel 300. The pads DP may be located closer to the edge of the display panel 300 than the flexible circuit film 400.

The scan driver SCP may be connected to the flexible circuit film 400 by a plurality of first scan control lines SCL. The scan driver SCP may receive a scan control signal SCS and an emission control signal ECS from the flexible circuit film 400 through the scan control lines SCL.

The scan driver SCP may include a scan signal driver SDP and an emission signal driver EDP as illustrated in FIG. 4.

The scan signal driver SDP may generate scan signals according to the scan control signal SCS and sequentially output the scan signals to the scan lines SL. The emission signal driver EDP may generate emission control signals according to the emission control signal ECS and sequentially output the emission control signals to the emission lines EL.

The scan driver SCP may include a plurality of thin-film transistors. The scan driver SCP may be formed on the same layer as the thin-film transistors of the subpixels SP. Although the scan driver SCP is formed in the non-display area NDA on a side of the display area DA, for example, on a left side of the display area DA in FIG. 3, embodiments are not limited thereto. For example, according to some example embodiments, the scan driver SCP may be formed in the non-display area NDA on both sides of the display area DA, for example, on left and right sides of the display area DA.

The flexible circuit film 400 may include a timing controller TCP, a data driver DDP, and a power supply circuit PSP as illustrated in FIG. 4.

The timing controller TCP receives digital video data DATA and timing signals from the circuit board 500. According to the timing signals, the timing controller TCP may generate the scan control signal SCS for controlling the operation timing of the scan signal driver SDP, generate the emission control signal ECS for controlling the operation timing of the emission signal driver EDP, and generate a data control signal DCS for controlling the operation timing of the data driver DDP. The timing controller TCP may output the scan control signal SCS to the scan signal driver SDP and the emission control signal ECS to the emission signal driver EDP through the scan control lines SCL. The timing controller TCP may output the digital video data DATA and the data control signal DCS to the data driver DDP.

The data driver DDP converts the digital video data DATA into analog positive/negative data voltages and output the analog positive/negative data voltages to the data lines DL through the fan-out lines FL. Subpixels SP are selected by the scan signals of the scan driver SCP, and the data voltages are supplied to the selected subpixels SP.

The power supply circuit PSP may generate a first driving voltage and supply the first driving voltage to the first driving voltage lines VDDL. In addition, the power supply circuit PSP may generate a second driving voltage and supply the second driving voltage to a cathode of the organic light emitting diode of each of the subpixels SP. The first driving voltage may be a high-potential voltage for driving the organic light emitting diode, and the second driving voltage may be a low-potential voltage for driving the organic light emitting diode. That is, the first driving voltage may have a higher potential than the second driving voltage.

The flexible circuit film 400 may include the base film 410 and the driver circuit 450 located on the base film 410. That is, the driver circuit 450 may be formed as an integrated circuit and mounted on the base film 410 of the flexible circuit film 400 using a chip-on-film (COF) method. However, embodiments are not limited thereto, and the driver circuit 450 may also be located on the display panel 300 using a chip-on-glass (COG) method, a chip-on-plastic (COP) method, or an ultrasonic bonding method.

The flexible circuit film 400 may be attached onto the pads DP using an anisotropic conductive film. Therefore, lead lines (first signal wirings TSL1 and TSL2 of FIG. 5 and second signal wirings PL1 and PL2 of FIG. 5) of the flexible circuit film 400 may be electrically connected to the pads DP.

Figure 5:
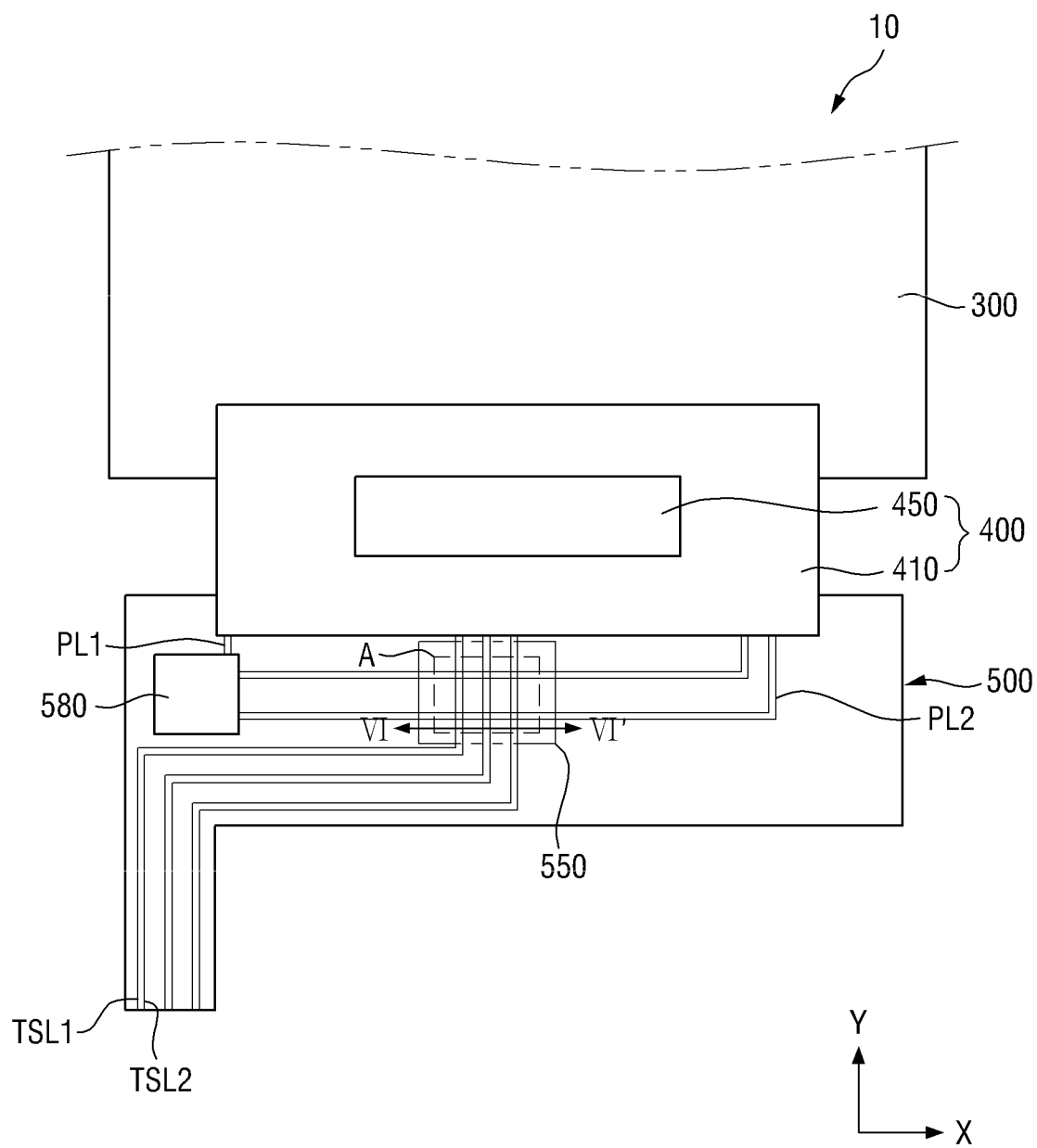
FIG. 5 is a plan layout view of a display panel, a flexible circuit film, and a driver circuit board according to some example embodiments.
Figure 6:
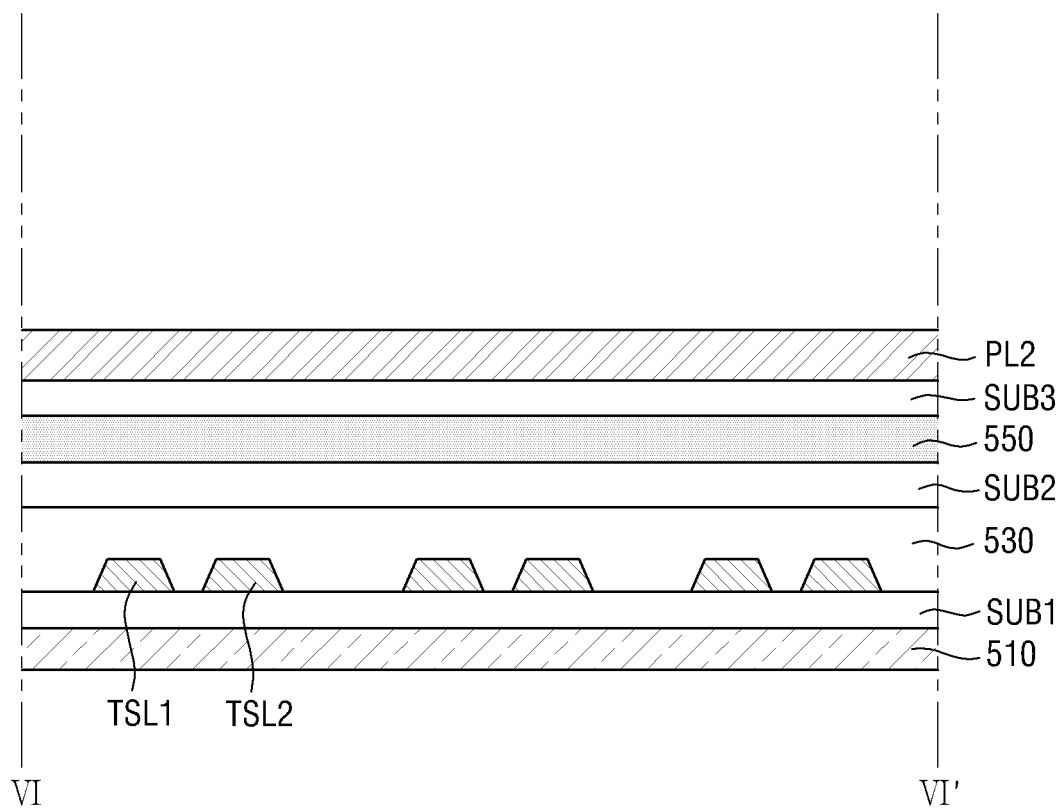
FIG. 6 is a cross-sectional view taken along the line VI-VI' of FIG. 5.

FIG. 5 is a plan layout view of the display panel 300, the flexible circuit film 400, and the driver circuit board 500 according to some example embodiments. FIG. 6 is a cross-sectional view taken along the line VI-VI' of FIG. 5.

Referring to FIGS. 5 and 6, the circuit board 500 includes a plurality of stacked elements. The circuit board 500 may include a first base substrate SUB1, a first wiring layer located on the first base substrate SUB1 and including a plurality of signal wirings TSL1 and TSL2, a second base substrate SUB2 located on the first wiring layer, a first ground wiring layer 550 located on the second base substrate SUB2, a third base substrate SUB3 located on the first ground wiring layer 550, and a second wiring layer including a plurality of second signal wirings PL1 and PL2 located on the third base substrate SUB3.

Each of the base substrates SUB1 through SUB3 may support the first wiring layer, the first ground wiring layer 550, and the second wiring layer. The base substrates SUB1 through SUB3 may include a flexible material.

The circuit board 500 may further include a second ground wiring layer 510 spaced apart from the first wiring layer with the first base substrate SUB1 interposed between them.

First signal wirings TSL1 and second signal wirings TSL2 may electrically connect the main processor 710 of the main circuit board 700 and the driver circuit 450. The first signal wirings TSL1 and the second signal wirings TSL2 may receive image data signals or timing control signals generated by the main processor 710. A first signal wiring TSL1 and a second signal wiring TSL2 adjacent to each other may have signals of the same magnitude but opposite signs. For example, the first signal wiring TSL1 may have a positive value, and the second signal wiring TSL2 may have a negative value, but their signal magnitudes may be the same (have the same absolute value). Because adjacent first and second signal wirings TSL1 and TSL2 have signals of the same magnitude and opposite signs, they may cancel out noising even if the noising occurs.

The signal wirings TSL1 and TSL2 may extend up to an area where the cable 590 (see FIG. 2) is located.

Referring to FIG. 5, the first ground wiring layer 550 may be located in a central part of the circuit board 500. In an area overlapping the first ground wiring layer 550, the first signal wirings TSL1 and the second signal wirings TSL2 may extend along the second direction (Y-axis direction).

The first ground wiring layer 550 may prevent or reduce electrical/magnetic effects or interaction between the first wiring layer and the second wiring layer. The first ground wiring layer 550 may include a shielding metal. The shielding metal may be, but is not limited to, copper (Cu).

The first ground wiring layer 550 may include a mesh pattern area and a non-mesh pattern area in a plan view. Because the first ground wiring layer 550 has the mesh pattern area, it can lower impedance of the signal wirings TSL1 and TSL2 of the first wiring layer.

The mesh pattern area of the first ground wiring layer 550 may include mesh patterns and openings surrounded by the mesh patterns. In the openings, the signal wirings TSL1 and TSL2 of the first wiring layer and the signal wirings PL1 and PL2 of the second wiring layer may be electrically affected by each other, thereby degrading signal quality. However, in the display device 10 according to some example embodiments, the first ground wiring layer 550 further includes the non-mesh pattern area in an area where the signal wirings of the first wiring layer and the second wiring layer overlap each other in a thickness direction. Therefore, electrical effects between the signal wirings TSL1 and TSL2 of the first wiring layer and the signal wirings PL1 and PL2 of the second wiring layer, which could otherwise cause degraded signal quality, may be prevented or reduced.

The signal wirings PL1 and PL2 of the second wiring layer may extend from the power supply unit 580 and may be connected to the flexible circuit film 400. The signal wirings PL1 and PL2 may pass through the flexible circuit film 400 and then may be electrically connected to the first driving voltage lines VDDL of the display panel 300 or the cathode of each organic light emitting diode.

Third signal wirings PL1 extending from the power supply unit 580 may extend along the second direction (Y-axis direction) and may be connected to a side of the flexible circuit film 400 in the first direction (X-axis direction) as illustrated in FIG. 5. On the other hand, fourth signal wirings PL2 may extend along the first direction (X-axis direction) and then may be connected to the other side of the flexible circuit film 400 in the first direction (X-axis direction) as illustrated in FIG. 5. The fourth signal wirings PL2 may overlap the first ground wiring layer 550 and the signal wirings TSL1 and TSL2 in the thickness direction. The fourth signal wirings PL2 and the signal wirings TSL1 and TSL2 overlapping each other may be electrically affected by each other. However, as described above, the first ground wiring layer 550 according to the embodiment further includes the non-mesh pattern area in the area where the signal wirings of the first wiring layer and the second wiring layer overlap each other in the thickness direction. Therefore, electrical effects between the signal wirings TSL1 and TSL2 of the first wiring layer and the signal wirings PL1 and PL2 of the second wiring layer, which may otherwise degrade signal quality, may be prevented or reduced.

Like the first ground wiring layer 550, the second ground wiring layer 510 may prevent or reduce degradations of the signal quality of the signal wirings TSL1 and TSL2 of the first wiring layer due to other conductive elements located under the first base substrate SUB1. Unlike the first ground wiring layer 550, the second ground wiring layer 510 may not include the mesh pattern area and may include only the non-mesh pattern area. However, embodiments are not limited thereto.

Figure 7:
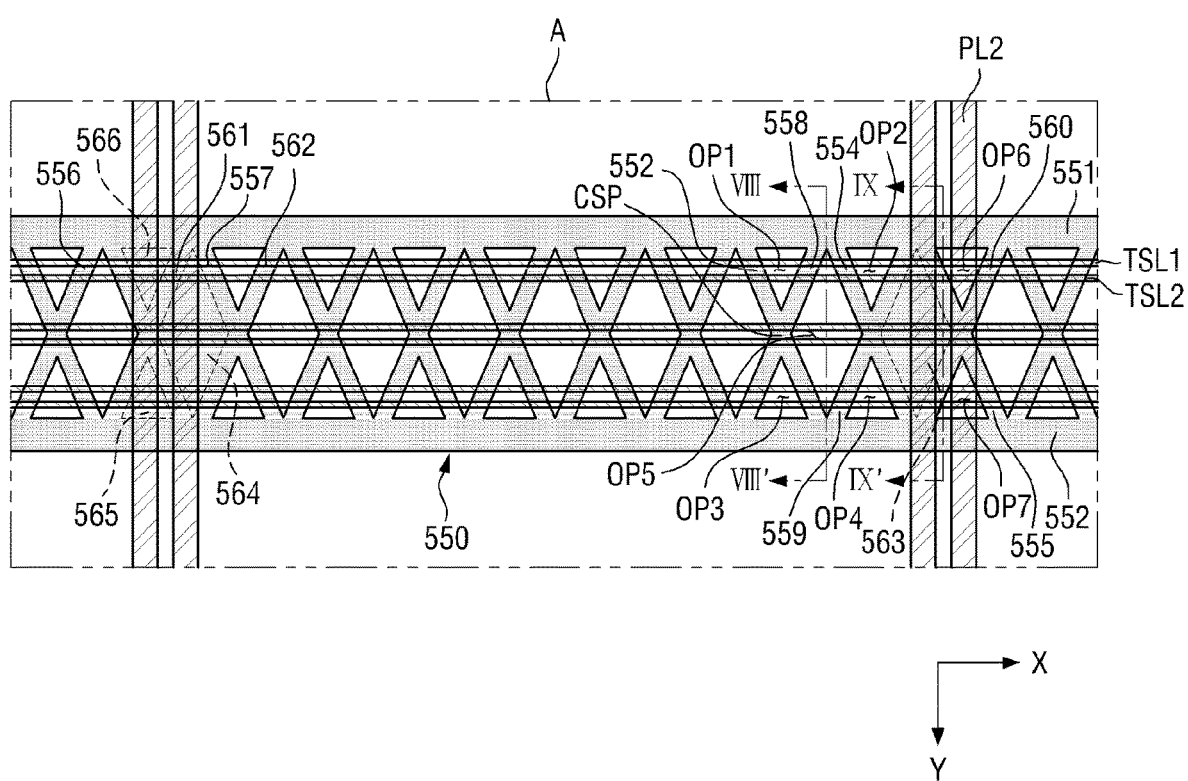
FIG. 7 is an enlarged plan view of the area A of FIG. 5.
Figure 8:
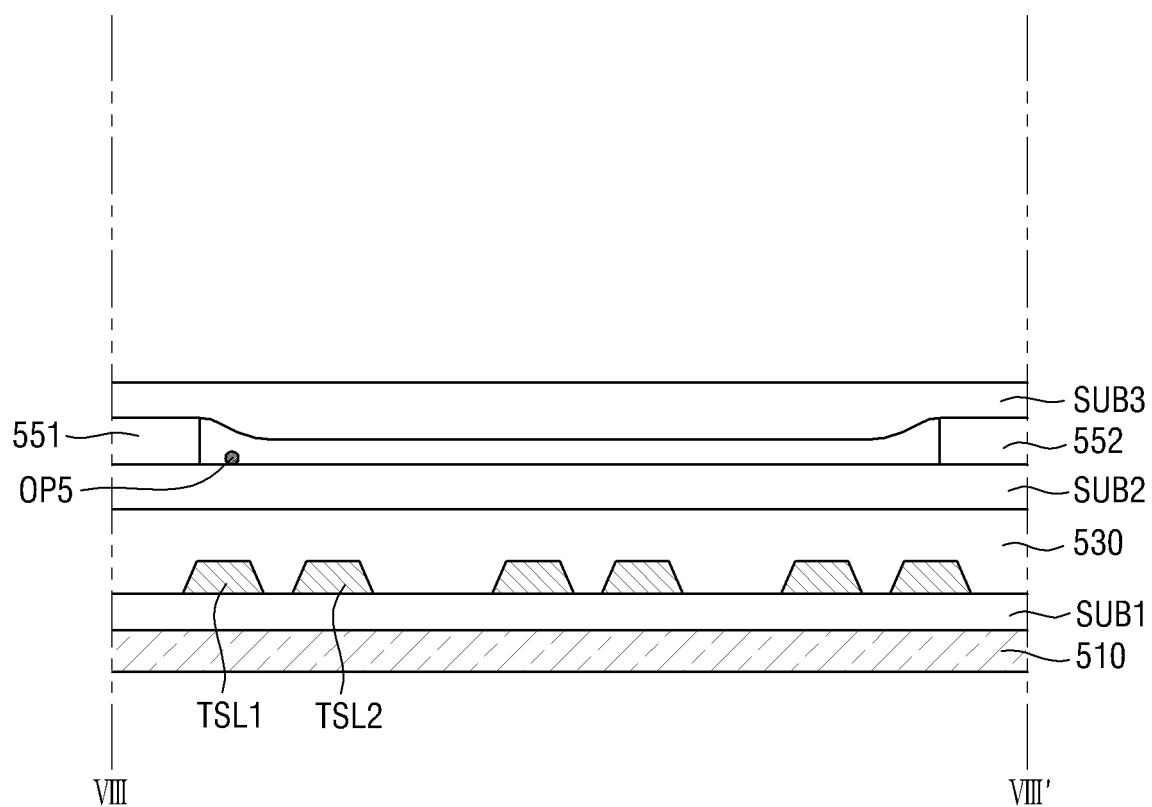
FIG. 8 is a cross-sectional view taken along the line VIII-VIII' of FIG. 7.
Figure 9:
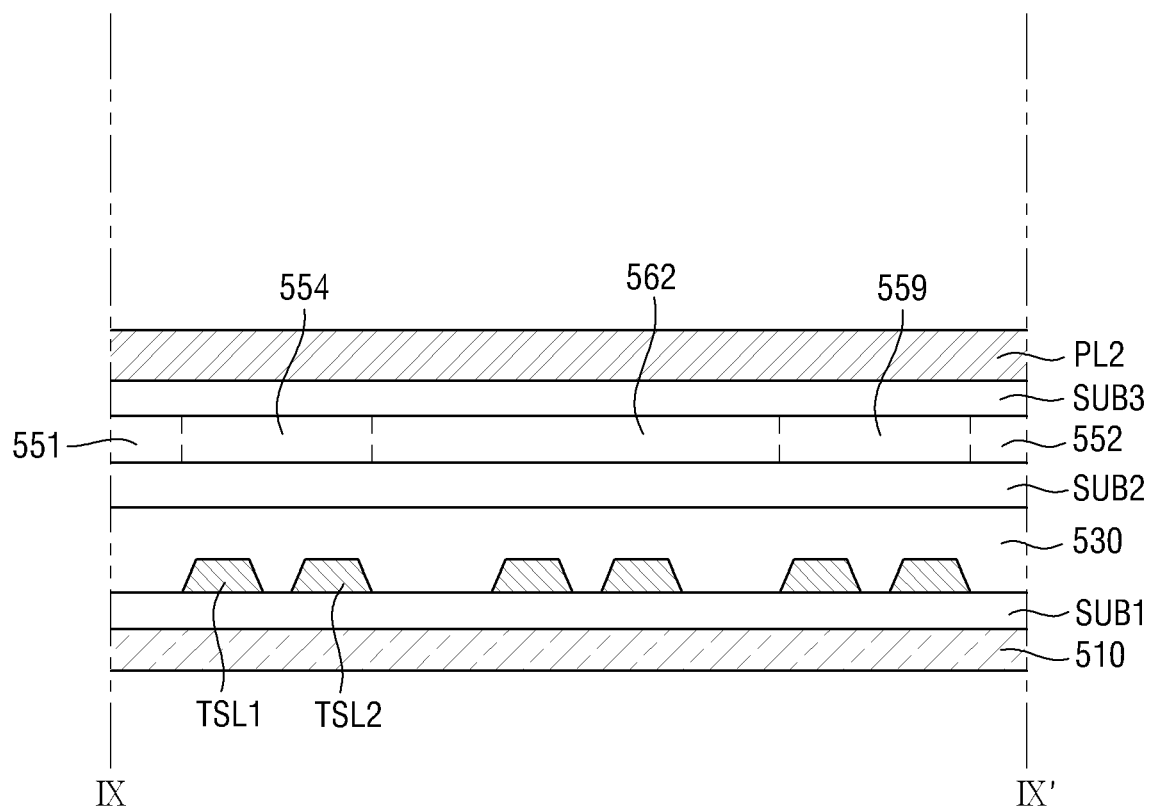
FIG. 9 is a cross-sectional view taken along the line IX-IX' of FIG. 7.

FIG. 7 is an enlarged plan view of area A of FIG. 5. FIG. 8 is a cross-sectional view taken along the line VIII-VIII' of FIG. 7. FIG. 9 is a cross-sectional view taken along the line IX-IX' of FIG. 7.

Referring to FIGS. 7 through 9, the first ground wiring layer 550 may include the mesh pattern area and the non-mesh pattern area. The mesh pattern area may include a plurality of mesh patterns and openings surrounded by adjacent mesh patterns. The non-mesh pattern area may include a plurality of mesh patterns and non-mesh patterns surrounded by adjacent mesh patterns.

The mesh patterns of the mesh pattern area and the non-mesh pattern area may include extension portions 551 and 552 extending in the first direction (X-axis direction). A first extension portion 551 may be spaced apart from a second extension portion 552 in the second direction (Y-axis direction). The extension portions 551 and 552 may overlap the signal wirings PL1 and PL2 of the second wiring layer.

The mesh patterns of the mesh pattern area and the pattern area may include a plurality of connection portions 553 through 562 physically connecting the first extension portion 551 and the second extension portion 552.

The second direction (Y-axis direction) may include a first side direction which is a downward direction in FIG. 7 and a second side direction which is an upward direction in FIG. 7.

The connection portions 553 through 557 may extend in a direction between the first direction (X-axis direction) and the first side direction of the second direction (Y-axis direction), and the connection portions 558 through 562 may extend in a direction between the first direction (X-axis direction) and the second side direction of the second direction (Y-axis direction). That is, the extending direction of the connection portions 553 through 557 and the extending direction of the connection portions 558 through 562 may intersect each other at intersection points CSP. The connection portions 553 through 557 may extend in a lower right direction from the first extension portion 551 and may be connected to the second extension portion 552, and the connection portions 558 through 562 may extend in a lower left direction from the first extension portion 552 and may be connected to the second extension portion 552.

A first opening OP1 may be located in a space surrounded by the first extension portion 551, a first connection portion 553, and a sixth connection portion 558. A second opening OP2 may be located in a space surrounded by the first extension portion 551, a second connection portion 554, and a seventh connection portion 559. A third opening OP3 may be located in a space surrounded by the second extension portion 552, the first connection portion 553, and the sixth connection portion 558. A fourth opening OP4 may be located in a space surrounded by the second extension portion 552, the second connection portion 554, and the seventh connection portion 559. A fifth opening OP5 may be located in a space surrounded by the first extension portion 551, the second extension portion 552, the sixth connection portion 558, the second connection portion 554, the first connection portion 553, and the seventh connection portion 559. A sixth opening OP6 may be located in a space surrounded by the first extension portion 551, a third connection portion 555, and an eighth connection portion 560. A seventh opening OP7 may be located in a space surrounded by the second extension portion 552, the third connection portion 555, and the eighth connection portion 560. A first non-mesh pattern 563 may be located in a space surrounded by the first extension portion 551, the second extension portion 552, the seventh connection portion 559, the second connection portion 554, the third connection portion 555, and the eighth connection portion 560. A fourth non-mesh pattern 566 may be located in a space surrounded by the first extension portion 551, a fourth connection portion 556, and a ninth connection portion 561. A third non-mesh pattern 565 may be located in a space surrounded by the second extension portion 552, the fourth connection portion 556, and the ninth connection portion 561. A second non-mesh pattern 564 may be located in a space surrounded by the first extension portion 551, the second extension portion 552, the ninth connection portion 561, the fourth connection portion 556, a fifth connection portion 557, and a tenth connection portion 562.

The non-mesh patterns 563 through 566 may be physically connected to adjacent connection portions.

The openings OP1 through OP7 may completely penetrate the first ground wiring layer 550 in the thickness direction from a surface of the first ground wiring layer 550.

Referring to FIGS. 7 and 8, the signal wirings TSL1 and TSL2 may overlap the connection portions 553 through 557 extending in the direction between the first direction (X-axis direction) and the first side direction of the second direction (Y-axis direction), the connection portions 558 through 562 extending in the direction between the first direction (X-axis direction) and the second side direction of the second direction (Y-axis direction), the openings OP1 through OP7, and the non-mesh patterns 563 through 566 in the thickness direction.

The signal wirings PL1 and PL2 may overlap the signal wirings TSL1 and TSL2 in the thickness direction.

The signal wirings PL1 and PL2 located on a right side may overlap the third connection portion 555, the first non-mesh pattern 563, and the eighth connection portion 560 in the thickness direction as illustrated in FIGS. 7 and 9. The signal wirings PL1 and PL2 located on a left side may overlap the fourth non-mesh pattern 566, the fourth connection portion 556, the ninth connection portion 561, the third non-mesh pattern 565, and the second non-mesh pattern 564 in the thickness direction.

The signal wirings PL1 and PL2 located on the right side may overlap the extension portions 551 and 552, the seventh connection portion 559, the third connection portion 555, the first non-mesh pattern 563, the second connection portion 554, and the eighth connection portion 560 in the thickness direction in their areas overlapping the signal wirings TSL1 and TSL2 in the thickness direction. The signal wirings PL1 and PL2 located on the left side may overlap the extension portions 551 and 552, the fourth connection portion 556, the ninth connection portion 561, the fifth connection portion 557, and the non-mesh patterns 564 through 566 in the thickness direction in their areas overlapping the signal wirings TSL1 and TSL2 in the thickness direction.

As described above, the fourth signal wirings PL2 may overlap the first ground wiring layer 550 and the signal wirings TSL1 and TSL2 in the thickness direction. The fourth signal wirings PL2 and the signal wirings TSL1 and TSL2 overlapping each other may be electrically affected by each other. However, as described above, the first ground wiring layer 550 according to the embodiment further includes the non-mesh pattern area in the area where the signal wirings of the first wiring layer and the second wiring layer overlap each other in the thickness direction. Therefore, electrical effects or interactions between the signal wirings TSL1 and TSL2 of the first wiring layer and the signal wirings PL1 and PL2 of the second wiring layer, which may otherwise degrade signal quality, may be prevented or reduced.

Further details according to some example embodiments will now be described in more detail below. In the following embodiments, a description of the same elements as those of the above-described embodiments may be omitted or explained briefly, and differences will be mainly described.

Figure 10:
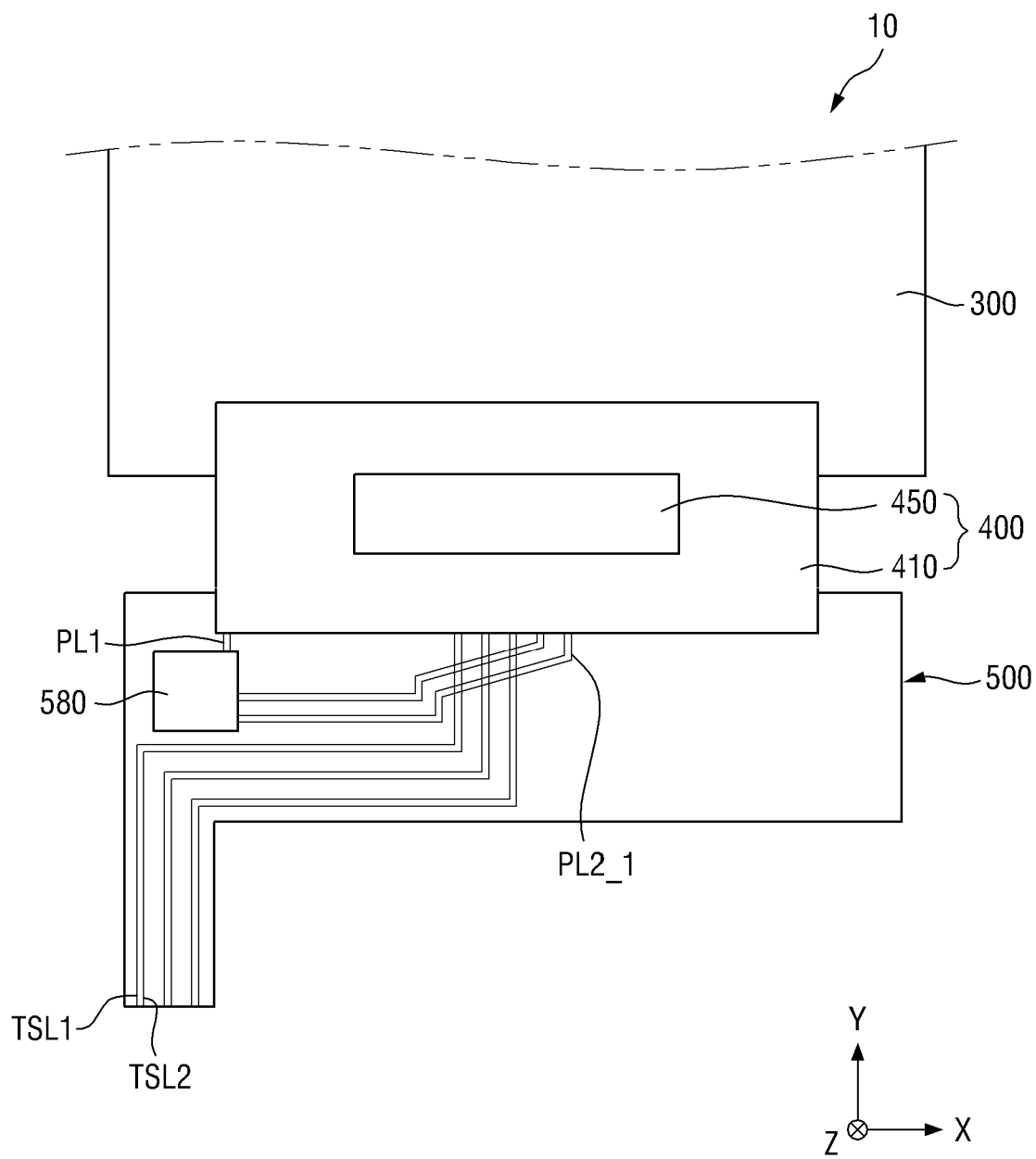
FIG. 10 is a plan layout view of a display panel, a flexible circuit film, and a driver circuit board according to some example embodiments.
Figure 11:
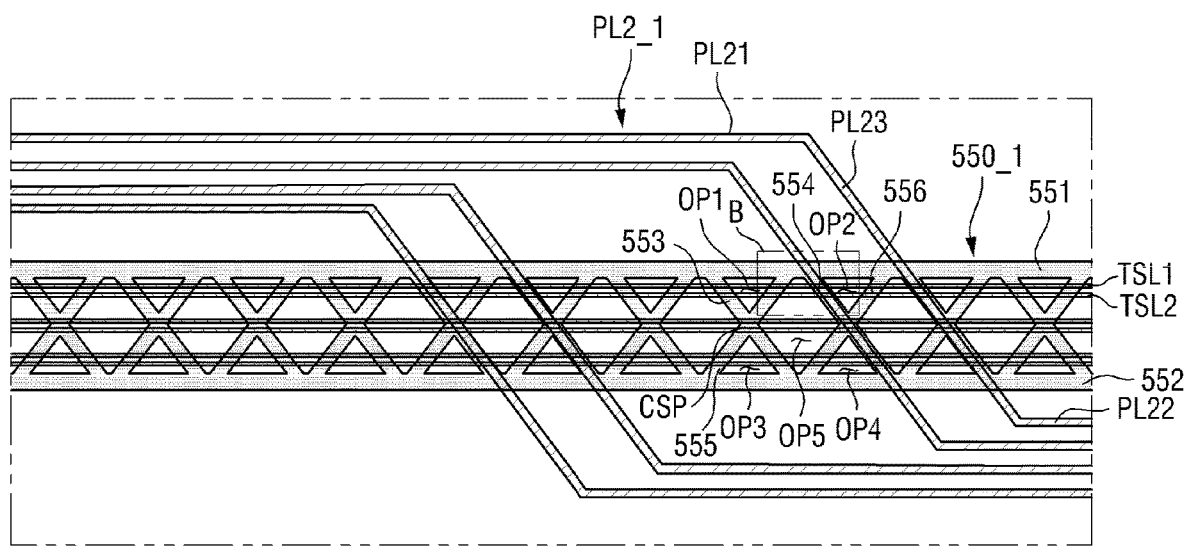
FIG. 11 is a partial enlarged view of FIG. 10.
Figure 12:
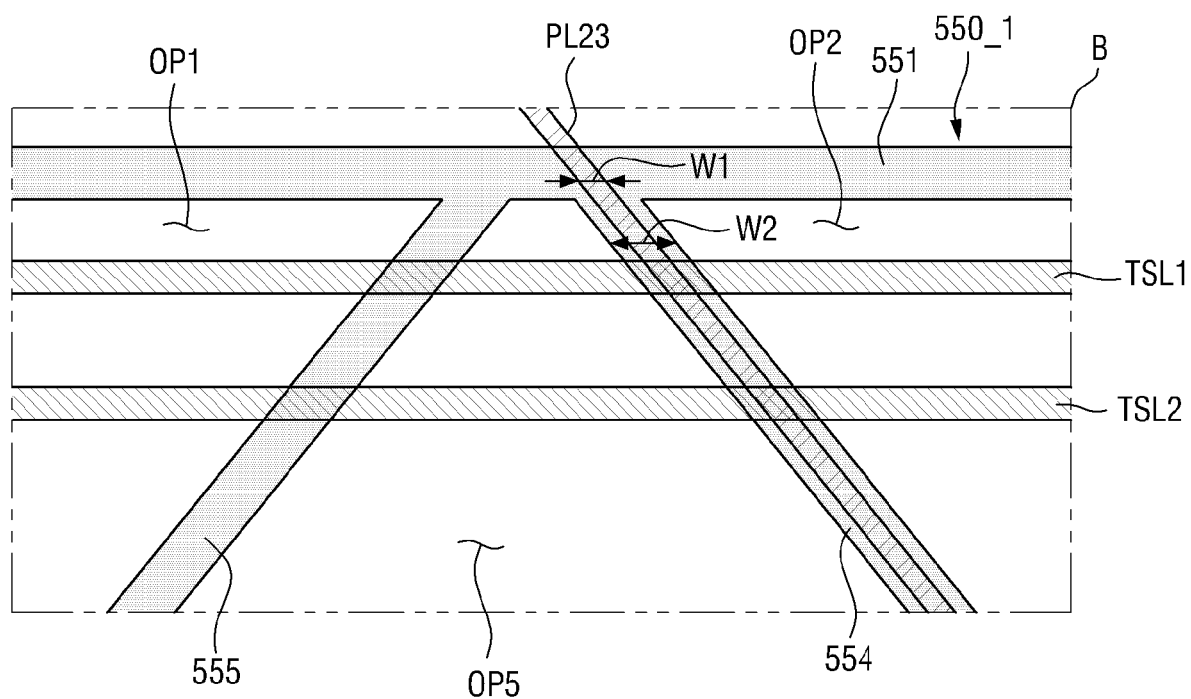
FIG. 12 is an enlarged plan view of area B of FIG. 11.

FIG. 10 is a plan layout view of a display panel 300, a flexible circuit film 400, and a driver circuit board 500 according to some example embodiments. FIG. 11 is a partial enlarged view of FIG. 10. FIG. 12 is an enlarged plan view of area B of FIG. 11.

Referring to FIGS. 10 through 12, a display device according to some example embodiments is different from the display device 10 illustrated in FIG. 5 in that fourth signal wirings PL2_1 extend between the first direction (X-axis direction) and the first side direction of the second direction (Y-axis direction) in their areas overlapping signal wirings TSL1 and TSL2.

Each of the fourth signal wirings PL2_1 may include a first sub-wiring portion PL21 and a second sub-wiring portion PL22 extending in the first direction (X-axis direction) and a third sub-wiring portion PL23 physically connecting the first sub-wiring portion PL21 and the second sub-wiring portion PL22. The third sub-wiring portion PL23 may overlap the signal wirings TSL1 and TSL2 in the thickness direction.

A first ground wiring layer 550_1 may include a mesh pattern area. The first ground wiring layer 550_1 may not include a non-mesh pattern area, unlike the first ground wiring layer 550 of FIG. 7. The mesh pattern area may include a plurality of mesh patterns and openings surrounded by adjacent mesh patterns.

The mesh patterns of the mesh pattern area may include extension portions 551 and 552 extending in the first direction (X-axis direction). A first extension portion 551 may be spaced apart from a second extension portion 552 in the second direction (Y-axis direction). The extension portions 551 and 552 may overlap the signal wirings PL1 and PL2_1 of a second wiring layer.

The mesh patterns of the mesh pattern area and the non-mesh pattern area may include a plurality of connection portions 553 through 556 physically connecting the first extension portion 551 and the second extension portion 552.

The connection portions 553 and 554 may extend in a direction between the first direction (X-axis direction) and the first side direction of the second direction (Y-axis direction), and the connection portions 555 and 556 may extend in a direction between the first direction (X-axis direction) and the second side direction of the second direction (Y-axis direction).

That is, the extending direction of the connection portions 553 and 554 and the extending direction of the connection portions 555 and 556 may intersect each other at intersection points CSP. The connection portions 553 and 554 may extend in the lower right direction from the first extension portion 551 and may be connected to the second extension portion 552, and the connection portions 555 and 556 may extend in the lower left direction from the first extension portion 551 and may be connected to the second extension portion 552.

A first opening OP1 may be located in a space surrounded by the first extension portion 551, a first connection portion 553, and a third connection portion 555. A second opening OP2 may be located in a space surrounded by the first extension portion 551, a second connection portion 554, and a fourth connection portion 556. A third opening OP3 may be located in a space surrounded by the second extension portion 552, the first connection portion 553, and the third connection portion 555. A fourth opening OP4 may be located in a space surrounded by the second extension portion 552, the second connection portion 554, and the fourth connection portion 556. A fifth opening OP5 may be located in a space surrounded by the first extension portion 551, the second extension portion 552, the first connection portion 553, the second connection portion 554, the third connection portion 555, and the fourth connection portion 556.

The openings OP1 through OP4 may completely penetrate the first ground wiring layer 550_1 in the thickness direction from a surface of the first ground wiring layer 550_1.

Referring to FIG. 11, the signal wirings TSL1 and TSL2 may overlap the connection portions 553 and 554 extending in the direction between the first direction (X-axis direction) and the first side direction of the second direction (Y-axis direction), the connection portions 555 and 556 extending in the direction between the first direction (X-axis direction) and the second side direction of the second direction (Y-axis direction), and the openings OP1 through OP5 in the thickness direction.

The signal wirings PL1 and PL2_1 may overlap the signal wirings TSL1 and TSL2 in the thickness direction.

The signal wirings PL1 and PL2_1 may overlap the first connection portion 553 or the second connection portion 554 in the thickness direction. According to some example embodiments, the signal wirings PL1 and PL2_1 may extend in the same direction as the connection portions 553 and 554.

In some embodiments, when the signal wirings PL1 and PL2_1 extend in the same direction as the connection portions 555 and 556, they may overlap the third connection portion 555 or the fourth connection portion 556 in the thickness direction.

Referring to FIG. 12, a width W1 of each of the signal wirings PL1 and PL2_1 in the first direction (X-axis direction) may be smaller than a width W2 of each of the connection portions 553 and 554 in the first direction (X-axis direction).

The fourth signal wirings PL2_1 may overlap the first ground wiring layer 550_1 and the signal wirings TSL1 and TSL2 in the thickness direction. The fourth signal wirings PL2_1 and the signal wirings TSL1 and TSL2 overlapping each other may be electrically affected by each other. However, the connection portions of the first ground wiring layer 550_1 including only the mesh pattern area cover the fourth signal wirings PL2_1 in a plan view in an area where the signal wirings of a first wiring layer and the second wiring layer overlap each other in the thickness direction. Therefore, electrical effects or interactions between the signal wirings TSL1 and TSL2 of the first wiring layer and the signal wirings PL1 and PL2_1 of the second wiring layer, which may otherwise degrade signal quality, may be prevented or reduced.

Figure 13:
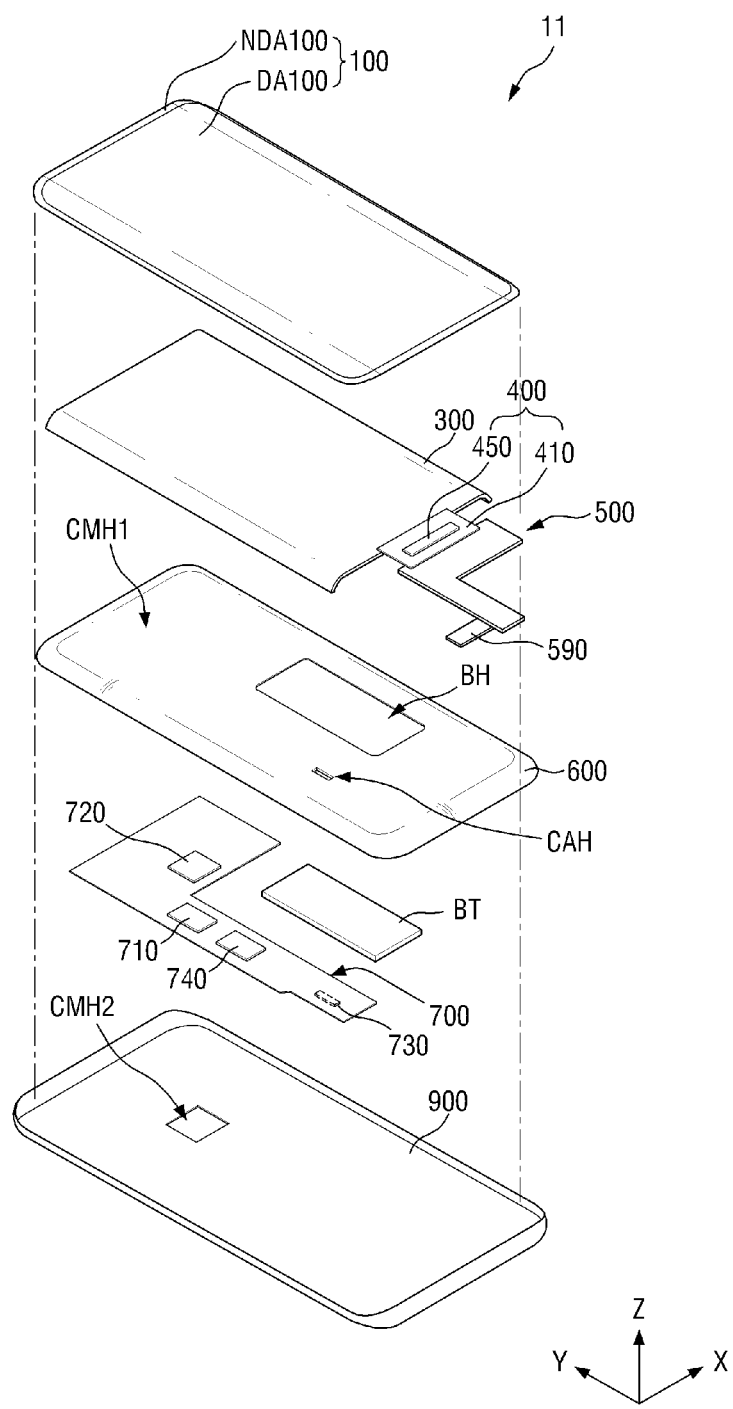
FIG. 13 is an exploded perspective view of a display device according to some example embodiments.
Figure 14:
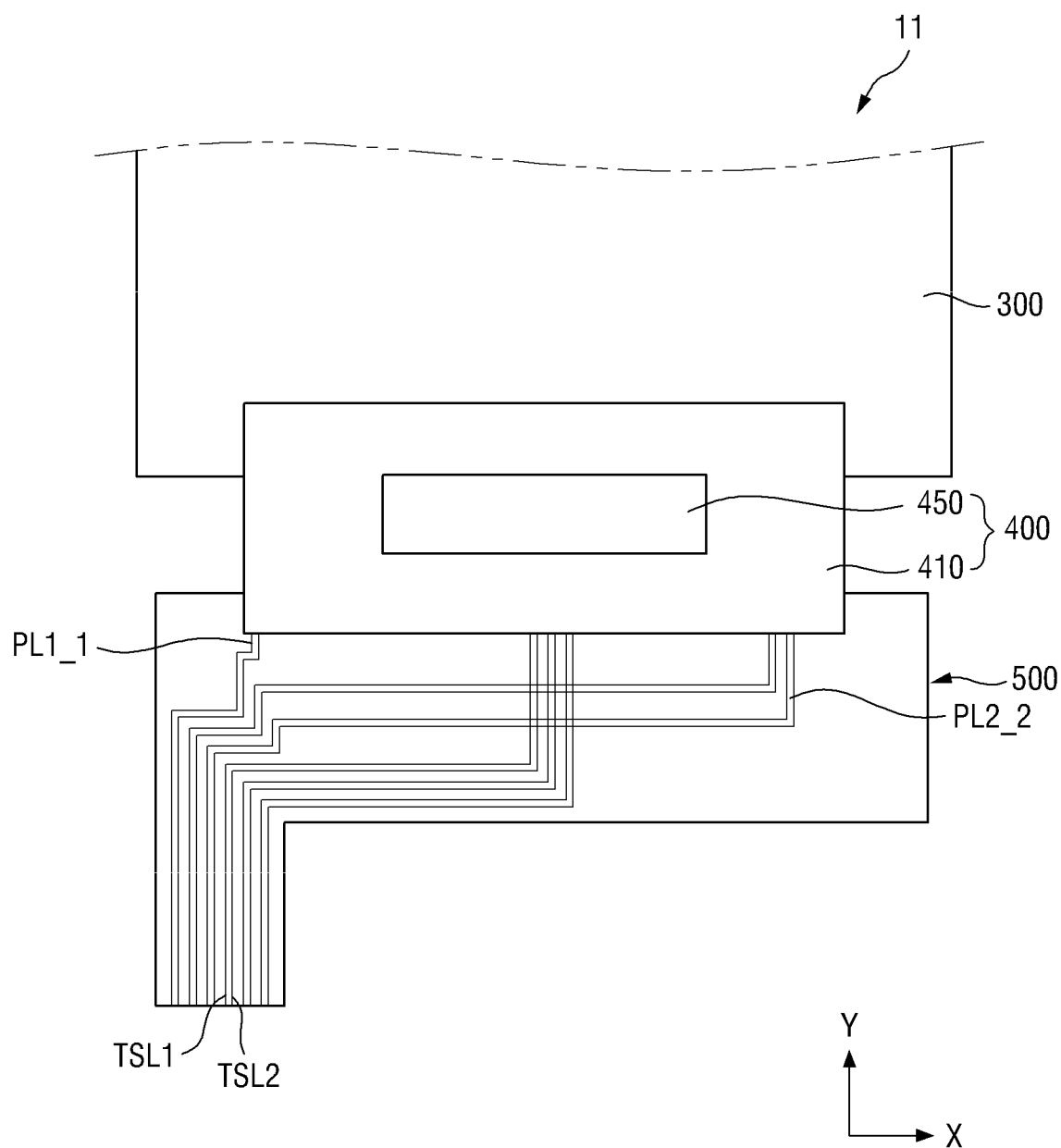
FIG. 14 is a plan layout view of a display panel, a flexible circuit film, and a driver circuit board according to some example embodiments.

FIG. 13 is an exploded perspective view of a display device 11 according to some example embodiments. FIG. 14 is a plan layout view of a display panel 300, a flexible circuit film 400, and a driver circuit board 500 according to some example embodiments.

Referring to FIGS. 13 and 14, the display device 11 according to some example embodiments is different from the display device 10 illustrated in FIG. 2 in that a power driver is omitted from the circuit board 500, and a main circuit board 700 further includes a power driver 740.

For example, in the display device 11 according to some example embodiments, the power driver may be omitted from the circuit board 500, and the main circuit board 700 may further include the power driver 740.

Referring to FIG. 14, signal wirings TSL1 and TSL2 and signal wirings PL1_1 and PL2_2 may extend up to an area where a cable 590 (see FIG. 2) is located.

While the present disclosure has been particularly shown and described with reference to example embodiments thereof, it will be understood by those of ordinary skill in the art that various changes in form and detail may be made therein without departing from the spirit and scope of the present disclosure as defined by the following claims, and their equivalents. The example embodiments should be considered in a descriptive sense only and not for purposes of limitation.

What is claimed is:

1. A display device comprising:
a display panel;
a first substrate connected to the display panel;
a second substrate connected to the display panel and the first substrate; and
a main circuit board electrically connected to the first substrate,
wherein the first substrate comprises:
a first base substrate;
a first wiring layer having a plurality of first signal wirings on the first base substrate;
a first ground wiring layer on the first wiring layer, and
a second wiring layer having a plurality of second signal wirings on the first ground wiring layer,
wherein the first ground wiring layer comprises a mesh pattern area and a non-mesh pattern area, wherein the mesh pattern area comprises a plurality of first mesh patterns and openings surrounded by adjacent first mesh patterns, and the non-mesh pattern area comprises a plurality of second mesh patterns and non-mesh patterns surrounded by adjacent second mesh patterns, wherein the non-mesh patterns are physically connected to the adjacent second mesh patterns,
wherein the first signal wirings extend along a first direction, and the second signal wirings extend along a second direction intersecting the first direction,
wherein the second substrate comprises a driver chip,
wherein the first signal wirings are configured to receive transmission signals from the main circuit board,
wherein the transmission signals comprise image signals or timing control signals, and the first signal wirings are electrically connected to the driver chip.

2. The display device of claim 1, wherein the second signal wirings comprise power signals.

3. The display device of claim 2, wherein the first substrate further comprises a power supply unit, and the second signal wirings pass through the second substrate and are electrically connected to power wirings of the display panel.

4. A display device comprising:
a display panel;
a first substrate connected to the display panel;
a second substrate connected to the display panel and the first substrate; and
a main circuit board electrically connected to the first substrate,
wherein the first substrate comprises:
a first base substrate;
a first wiring layer having a plurality of first signal wirings on the first base substrate;
a first ground wiring layer on the first wiring layer;
a second wiring layer on the first ground wiring layer and having a plurality of second signal wirings, wherein the first ground wiring layer comprises a plurality of mesh patterns and openings surrounded by adjacent mesh patterns, and the second signal wirings overlap the mesh patterns in a thickness direction,
wherein the second substrate comprises a driver chip,
wherein the first signal wirings are configured to receive transmission signals from the main circuit board,
wherein the transmission signals comprise image signals or timing control signals, and the first signal wirings are electrically connected to the driver chip.

5. The display device of claim 4, wherein the second signal wirings do not overlap the openings in the thickness direction.

6. The display device of claim 4, wherein a width of each of the second signal wirings is smaller than that of each of the mesh patterns.

7. The display device of claim 4, wherein the first signal wirings extend along a first direction, and the mesh patterns comprise a first extension portion and a second extension portion which extend along the first direction and are spaced apart from each other in a second direction intersecting the first direction and connection portions which physically connect the first extension portion and the second extension portion, wherein the second signal wirings extend along a direction in which the connection portions extend.

8. The display device of claim 4, wherein the first substrate further comprises a second ground wiring layer spaced apart from the first wiring layer with the first base substrate interposed between the second ground wiring layer and the first wiring layer and a second base substrate spaced apart from the first base substrate with the first wiring layer interposed between the second base substrate and the first base substrate, wherein the first ground wiring layer is spaced apart from the first wiring layer with the second base substrate interposed between the first ground wiring layer and the first wiring layer.

* * * * *